US010171080B2

(12) United States Patent
Garg

(10) Patent No.: US 10,171,080 B2
(45) Date of Patent: Jan. 1, 2019

(54) VOLTAGE LEVEL SHIFTER (VLS) CIRCUITS EMPLOYING A PRE-CONDITIONING CIRCUIT FOR PRE-CONDITIONING AN INPUT SIGNAL TO BE VOLTAGE LEVEL SHIFTED IN RESPONSE TO A PRE-CHARGE PHASE

(71) Applicant: QUALCOMM Incorporated, San Diego, CA (US)

(72) Inventor: Manish Garg, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 141 days.

(21) Appl. No.: 15/270,174

(22) Filed: Sep. 20, 2016

(65) Prior Publication Data

US 2018/0083625 A1   Mar. 22, 2018

(51) Int. Cl.
| | |
|---|---|
| *G11C 7/00* | (2006.01) |
| *H03K 19/00* | (2006.01) |
| *G11C 5/14* | (2006.01) |
| *G11C 7/06* | (2006.01) |
| *G11C 7/12* | (2006.01) |

(Continued)

(52) U.S. Cl.
CPC ......... *H03K 19/0013* (2013.01); *G11C 5/147* (2013.01); *G11C 7/06* (2013.01); *G11C 7/12* (2013.01); *G11C 8/08* (2013.01); *H03K 19/018507* (2013.01); *H03K 19/018521* (2013.01); *H03K 19/018571* (2013.01)

(58) Field of Classification Search
CPC ....... H03K 19/0013; H03K 19/018571; H03K 19/018507; H03K 19/018521; G11C 5/147; G11C 7/07; G11C 7/12; G11C 8/08

USPC ............................................. 365/189.11, 226
See application file for complete search history.

(56) References Cited

U.S. PATENT DOCUMENTS 6,650,158 B2 * 11/2003 Eliason .................... G11C 11/22
327/203
7,602,217 B2 * 10/2009 Watson .......... H03K 19/018528
326/113

(Continued)

OTHER PUBLICATIONS

US 10,128,845-B2, Nov. 2018, Garg; Manish, H03K 19/0013, (withdrawn).*

(Continued)

*Primary Examiner* — Viet Q Nguyen
(74) *Attorney, Agent, or Firm* — W&T/Qualcomm

(57) ABSTRACT

Voltage level shifter (VLS) circuits employing a pre-conditioning circuit for pre-conditioning an input signal to be voltage level shifted in response to a pre-charge phase are disclosed. A VLS circuit is configured to voltage level shift an input signal in a lower voltage domain on an output node in a higher voltage domain. The VLS circuit includes a pre-charge circuit configured to pre-charge the output node in a pre-charge phase. The VLS circuit also includes a pull-up circuit and a pull-down circuit that are configured to pull-up and pull-down the pre-charge phase of the output node, respectively, in an evaluation phase based on a logic state of the input signal to generate the output signal. To mitigate or avoid contention between the pull-up and pull-down circuits in the evaluation phase, the input signal is pre-conditioned such that the pull-down circuit is deactivated in response to the pre-charge phase.

27 Claims, 9 Drawing Sheets

(51) Int. Cl.
*G11C 8/08* (2006.01)
*H03K 19/0185* (2006.01)

(56) References Cited

U.S. PATENT DOCUMENTS

| | | | | |
|---|---|---|---|---|
| 7,777,523 B1* | 8/2010 | Masleid | ............ | H03K 3/35625 326/68 |
| 7,961,499 B2* | 6/2011 | Garg | ............ | G11C 11/419 365/154 |
| 8,559,247 B2 | 10/2013 | Shiu | | |
| 8,659,972 B2* | 2/2014 | Phan | ............ | G11C 8/08 365/194 |
| 8,724,373 B2* | 5/2014 | Garg | ............ | G11C 8/08 365/154 |
| 8,912,853 B2* | 12/2014 | Burnette | ............ | H03K 3/356121 331/185 |
| 9,129,706 B2* | 9/2015 | Shankar | ............ | G11C 5/063 |
| 9,270,275 B2 | 2/2016 | Song | | |
| 9,444,463 B2* | 9/2016 | Rao | ............ | H03K 19/018528 |
| 9,515,660 B1* | 12/2016 | Samson | ............ | H03K 19/018507 |
| 9,553,585 B1* | 1/2017 | Song | ............ | H03K 19/018528 |
| 9,768,779 B2* | 9/2017 | Nadkarni | ............ | H03K 19/018521 |
| 9,870,818 B1* | 1/2018 | Garg | ............ | G11C 11/418 |
| 9,881,669 B1* | 1/2018 | Bringivijayaraghavan | ............ | G11C 11/419 |
| 9,911,472 B1* | 3/2018 | Ge | ............ | G11C 7/12 |
| 2010/0188119 A1* | 7/2010 | Masleid | ............ | H03K 3/356139 326/63 |
| 2012/0044009 A1* | 2/2012 | Hess | ............ | H03K 3/356182 327/333 |
| 2012/0294095 A1 | 11/2012 | Shiu | | |
| 2013/0335152 A1* | 12/2013 | Burnette | ............ | H03K 3/0315 331/57 |
| 2015/0206578 A1* | 7/2015 | Goel | ............ | G11C 11/419 365/154 |
| 2015/0228314 A1* | 8/2015 | Bai | ............ | G11C 7/1087 365/189.05 |
| 2016/0218713 A1 | 7/2016 | Oh et al. | | |
| 2017/0047930 A1* | 2/2017 | Chai et al. | ............ | H03K 19/018528 |
| 2017/0373691 A1* | 12/2017 | Paasio | ............ | H03K 19/0185 |

OTHER PUBLICATIONS

International Search Report and Written Opinion for PCT/US2017/048564, dated Feb. 15, 2018, 26 pages.
Invitation to Pay Additional Fees and Partial International Search Report for PCT/US2017/048564, dated Dec. 22, 2017, 20 pages.
Second Written Opinion for PCT/US2017/048564, dated Aug. 28, 2018, 18 pages.

* cited by examiner

VOLTAGE LEVEL SHIFTER (VLS) CIRCUITS EMPLOYING A PRE-CONDITIONING CIRCUIT FOR PRE-CONDITIONING AN INPUT SIGNAL TO BE VOLTAGE LEVEL SHIFTED IN RESPONSE TO A PRE-CHARGE PHASE

BACKGROUND

I. Field of the Disclosure

The technology of the disclosure relates generally to voltage level shifting of signals from one voltage domain to a different voltage domain, and more particularly to half-voltage level shifter (HVLS) circuits for shifting signals from one voltage domain to a different voltage domain.

II. Background

Processor-based systems have access to a power supply that provides voltage to circuit components therein for powering operations. Particular components within a processor-based system may operate using less voltage than other components during certain operation modes. For example, a processor may use less voltage to operate during idle modes. On the other hand, memory may require a certain minimum voltage to retain data, regardless of the processor's mode of operation. In this regard, rather than providing a single voltage supply to supply a higher voltage to all components in a processor-based system, a plurality of supply voltages at different voltage levels may be made available to components of the processor-based system. Components, such as logic circuits, that can operate at a lower voltage are powered by a lower voltage in a first voltage domain. Components, such as memory, that may be required to operate at a higher voltage for data retention for example, are powered by a higher voltage in a second voltage domain. In this manner, power is conserved as opposed to providing a single higher voltage to all components.

To provide for signals from components in one voltage domain operating from a first voltage supply to be compatibly received and processed by components operating from a second voltage supply in another voltage domain, and vice versa, voltage level shifter (VLS) circuits are employed. FIG. 1 illustrates an exemplary electronic system 100 that includes multiple voltage domains, which are shown as a first voltage domain 102(1) and a second voltage domain 102(2). The first voltage domain 102(1) and the second voltage domain 102(2) are supplied with voltages of different voltage levels by first and second voltage supplies. VLS circuits 104(1)-104(N) are provided that are configured to shift respective input signals 106(1)-106(N) in the first voltage domain 102(1) to respective output signals 108(1)-108(N) in the second voltage domain 102(2). For example, the electronic system 100 may include logic circuits in the first voltage domain 102(1) designed to operate at lower voltage levels of 0.5 Volts (V) for example, and memory circuits in the second voltage domain 102(2) designed to operate at higher voltage levels of 1.0 Volts (V) for example. In this scenario, the VLS circuits 104(1)-104(N) illustrated in FIG. 1 would be low-to-high VLS circuits that are configured to shift the input signals 106(1)-106(N) from the lower, first voltage domain 102(1) of 0.5 V to the respective output signals 108(1)-108(N) in the higher, second voltage domain 102(2) of 1.0 V. In other words, if an input signal 106(1)-106(N) has a logic '1'/high value, meaning its voltage is approximately 0.5 V from being supplied by power in the lower, first voltage domain 102(1), the corresponding output signal 108(1)-108(N) will be shifted to remain a logic '1'/high value, but with a voltage of approximately 1.0 V of the higher, second voltage domain 102(2).

Memory systems may also be provided in dual voltage domains to further conserve power. For example, memory arrays that include memory bit cells that may require higher voltages for data retention are provided in a higher voltage domain. Circuits that support memory access to the memory array(s), such as decoders, driver circuits, and sense amplifiers for example, may be provided in a lower voltage domain. Thus, these dual voltage domain memory systems include VLS circuits to voltage level shift signals between the memory access circuits and the memory arrays. For example, these memory systems may employ VLS circuits in wordline decoders to generate word line signals to the memory array(s) in the higher voltage domain. Since a conventional memory system includes memory array(s) that include a large number of memory rows having corresponding word lines, a corresponding large number of HVLS circuits would be required to voltage level shift decoded wordline signals generated by the wordline decoders to the higher voltage domain, thus critically affecting the overall power/performance/area (PPA) of the memory circuit.

SUMMARY OF THE DISCLOSURE

Aspects of the present disclosure involve voltage level shifter (VLS) circuits employing a pre-conditioning circuit for pre-conditioning an input signal to be voltage level shifted in response to a pre-charge phase. The VLS circuits may be half-voltage level shifter (HVLS) circuits as an example. A VLS circuit includes a pre-charge circuit configured to pre-charge an output node in a pre-charge phase in response to a pre-charge control signal. The VLS circuit also includes a pull-up circuit (e.g., a P-type (P) metal oxide semiconductor (MOS) (PMOS)-based circuit) and a pull-down circuit (e.g., an N-type (N) MOS (NMOS)-based circuit) that are configured to pull-up and pull-down the pre-charge phase of the output node, respectively, based on a logic voltage level of an input signal in an evaluation phase to generate a voltage level shifted output signal on the output node in a higher voltage domain. To mitigate or avoid contention between the pre-charge circuit and the pull-down circuit in response to the pre-charge phase, the input signal is pre-conditioned based on the pre-condition control signal such that the pull-down circuit is not activated by the input signal in response to the pre-charge phase. For example, if the input signal were not pre-conditioned, the pull-down circuit may be required to include additional circuitry or components that are responsive to the pre-condition control signal, such as an additional stacked transistor, to deactivate the pull-down circuit during the pre-charge phase. However, providing an additional stacked transistor in the pull-down circuit may decrease the drive strength of the pull-down circuit. This may cause contention issues with the pull-up circuit during the evaluation phase unless the pull-up circuit is weakened and/or the pull-down circuit is strengthened with larger sized transistors, which can cause additional power consumption and area in an undesired manner Avoiding reducing the strength of the pull-down circuit can also allow the VLS circuit to operate over a wider range of voltages between the lower and higher voltage domains.

In this regard, in one exemplary aspect, a VLS circuit comprises a pre-conditioning circuit. The pre-conditioning circuit is configured to receive an input signal in a first voltage domain. The pre-conditioning circuit is also configured to generate a pre-conditioned input signal on an input node in the first voltage domain at a voltage level on an input node indicating a charge logic state, in response to a pre-condition control signal having a voltage level of the charge logic state indicating a pre-charge phase. The VLS circuit further comprises a pre-charge circuit coupled to an output node and a first supply rail of a supply voltage relative to a second supply rail in a second voltage domain higher than the first voltage domain. The pre-charge circuit is configured to couple the first supply rail to the output node in response to a pre-charge control signal indicating the pre-charge phase. The VLS circuit further comprises a pull-up circuit coupled to the first supply rail and the output node. The pull-up circuit is configured to couple the first supply rail to the output node in response to the pre-conditioned input signal having a voltage level of the charge logic state, and in response to the pre-condition control signal having a voltage level of a discharge logic state indicating an evaluation phase. The VLS circuit further comprises a pull-down circuit coupled to the input node and the second supply rail. The pull-down circuit is configured to decouple the second supply rail from the output node in response to the pre-condition control signal indicating the pre-charge phase. The pull-down circuit is further configured to couple the second supply rail to the output node in response to the pre-conditioned input signal having a voltage level of the discharge logic state, and in response to the pre-condition control signal indicating the evaluation phase.

In another exemplary aspect, a VLS circuit is provided. The VLS circuit comprises a means for receiving an input signal in a first voltage domain. The VLS circuit also comprises a means for generating a pre-conditioned input signal in the first voltage domain at a voltage level on an input node indicating a charge logic state, in response to a pre-condition control signal having a voltage level of the charge logic state indicating a pre-charge phase. The VLS circuit also comprises a means for coupling a first supply rail of a supply voltage relative to a second supply rail in a second voltage domain higher than the first voltage domain to an output node in response to a pre-charge control signal indicating the pre-charge phase. The VLS circuit also comprises a pull-up means for coupling the first supply rail to the output node in response to the pre-conditioned input signal having a voltage level of the charge logic state, and in response to the pre-condition control signal having a voltage level of a discharge logic state indicating an evaluation phase. The VLS circuit further comprises a pull-down means. The pull-down means comprises a means for decoupling the second supply rail from the output node in response to the pre-condition control signal indicating the pre-charge phase. The pull-down means also comprises a means for coupling the second supply rail to the output node in response to the pre-conditioned input signal having a voltage level of the discharge logic state, and in response to the pre-condition control signal indicating the evaluation phase.

In another exemplary aspect, a method of voltage level shifting an input signal from a lower voltage domain to a higher voltage domain is provided. The method comprises receiving an input signal in a first voltage domain. The method also comprises generating a pre-conditioned input signal on an input node in the first voltage domain at a voltage level indicating a charge logic state, in response to a pre-condition control signal having a voltage level of the charge logic state indicating a pre-charge phase. The method also comprises coupling a first supply rail to an output node in response to a pre-charge control signal indicating the pre-charge phase. The method also comprises coupling the first supply rail to the output node in response to the pre-conditioned input signal having a voltage level of the charge logic state, and in response to the pre-condition control signal having a voltage level of a discharge logic state indicating an evaluation phase. The method also comprises decoupling a second supply rail from the output node in response to the pre-condition control signal indicating the pre-charge phase. The method also comprises coupling the second supply rail to the output node in response to the pre-conditioned input signal having a voltage level of the discharge logic state, and in response to the pre-condition control signal indicating the evaluation phase.

In another exemplary aspect, a multiple voltage domain memory system is provided. The multiple voltage domain memory system comprises a memory array in a first voltage domain comprising a plurality of memory rows of a plurality of memory bit cells each configured to store data. The multiple voltage domain memory system comprises a plurality of output word lines in the first voltage domain, each coupled to a row of memory bit cells among the plurality of memory bit cells. The multiple voltage domain memory system also comprises a word line decoder. The word line decoder comprises an address input interface configured to receive a memory address associated with a memory row in the plurality of memory rows to be addressed. The address input interface is in a second voltage domain lower than the first voltage domain. The word line decoder also comprises a word line decoder circuit in the second voltage domain configured to receive the memory address and decode the memory address into a decoded word comprising a plurality of word line bit signals. The word line decoder further comprises a pre-conditioning circuit configured to receive a word line bit signal among the plurality of word line bit signals in the second voltage domain. The pre-conditioning circuit is also configured to generate a pre-conditioned signal on an input node in the second voltage domain at a voltage level indicating a charge logic state, in response to a pre-condition control signal having a voltage level of the charge logic state indicating a pre-charge phase. The word line decoder also comprises a plurality of VLS circuits. Each VLS circuit also comprises a pre-charge circuit coupled to an output word line among a plurality of output word lines and a first supply rail of a supply voltage relative to a second supply rail in the second voltage domain. The pre-charge circuit is configured to couple the first supply rail to the output word line in response to a pre-charge control signal indicating the pre-charge phase. Each VLS circuit also comprises a pull-up circuit coupled to the first supply rail and the output word line. The pull-up circuit is configured to couple the first supply rail to the output word line in response to the pre-conditioned signal having a voltage level of the charge logic state, and in response to the pre-condition control signal having a voltage level of a discharge logic state indicating an evaluation phase. Each VLS circuit also comprises a pull-down circuit coupled to the input node and the second supply rail. The pull-down circuit is configured to decouple the second supply rail from the output word line in response to the pre-condition control signal indicating the pre-charge phase. The pull-down circuit is also configured to couple the second supply rail to the output word line in response to the pre-conditioned signal having a voltage level of the discharge logic state in response to the pre-condition control signal indicating the evaluation phase.

DETAILED DESCRIPTION

Figure 1:
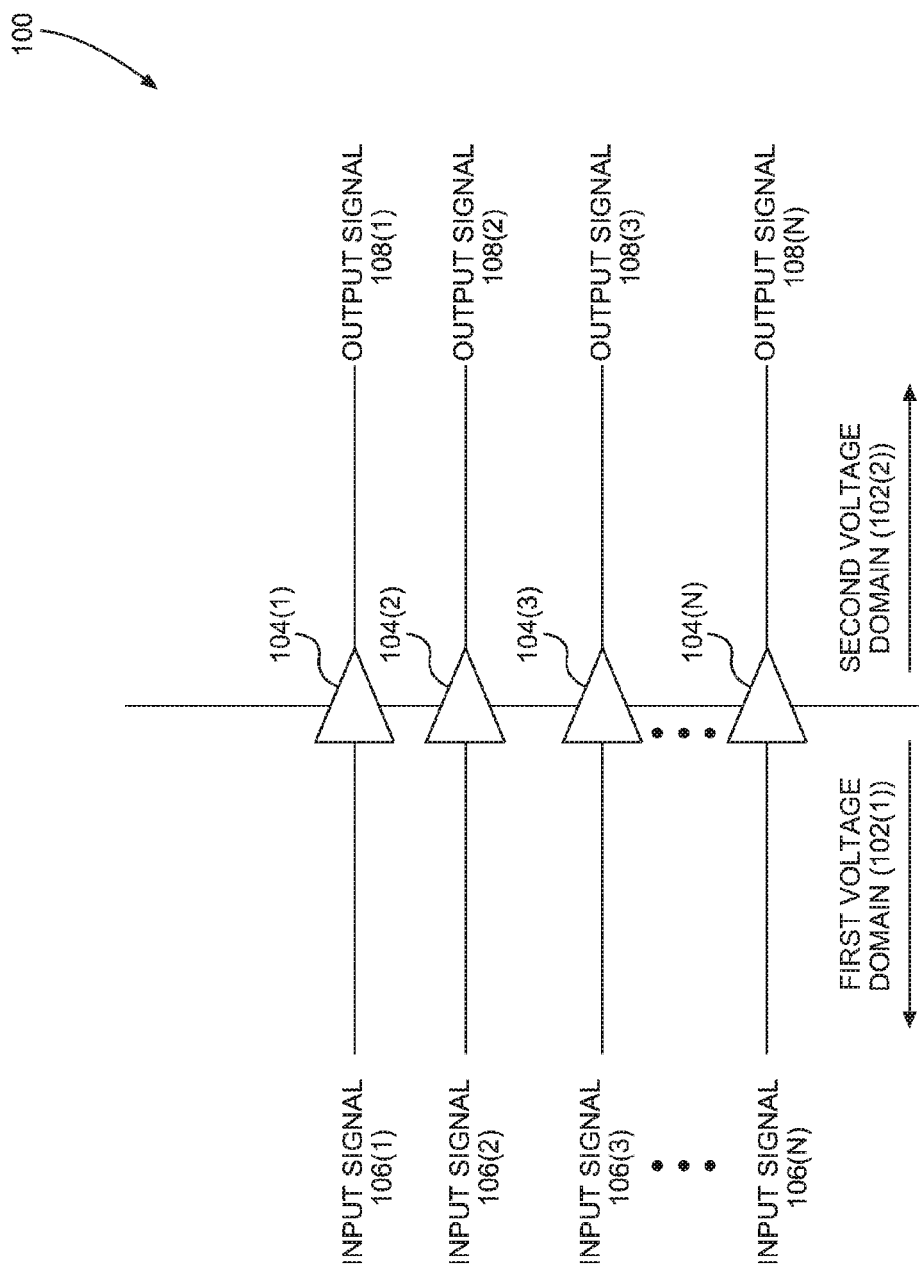
FIG. 1 is a schematic diagram of an exemplary electronic system that includes dual voltage domains and voltage level shifter (VLS) circuits configured to shift input signals in a lower voltage domain to corresponding output signals in a higher voltage domain.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects of the present disclosure involve voltage level shifter (VLS) circuits employing a pre-conditioning circuit for pre-conditioning an input signal to be voltage level shifted in response to a pre-charge phase. The VLS circuits may be half-voltage level shifter (HVLS) circuits as an example. A VLS circuit includes a pre-charge circuit configured to pre-charge an output node in a pre-charge phase in response to a pre-charge control signal. The VLS circuit also includes a pull-up circuit (e.g., a P-type (P) metal oxide semiconductor (MOS) (PMOS)-based circuit) and a pull-down circuit (e.g., an N-type (N) MOS (NMOS)-based circuit) that are configured to pull-up and pull-down the pre-charge phase of the output node, respectively, based on a logic voltage level of an input signal in an evaluation phase to generate a voltage level shifted output signal on the output node in a higher voltage domain. To mitigate or avoid contention between the pre-charge circuit and the pull-down circuit in response to the pre-charge phase, the input signal is pre-conditioned based on a pre-condition control signal such that the pull-down circuit is not activated by the input signal in response to the pre-charge phase. For example, if the input signal were not pre-conditioned, the pull-down circuit may be required to include additional circuitry or components that are responsive to the pre-condition control signal, such as an additional stacked transistor, to deactivate the pull-down circuit during the pre-charge phase. However, providing an additional stacked transistor in the pull-down circuit may decrease the drive strength of the pull-down circuit. This may cause contention issues with the pull-up circuit during the evaluation phase unless the pull-up circuit is weakened and/or the pull-down circuit is strengthened with larger sized transistors, which can cause additional power consumption and area in an undesired manner Avoiding reducing the strength of the pull-down circuit can also allow the VLS circuit to operate over a wider range of voltages between the lower and higher voltage domains.

Figure 2:
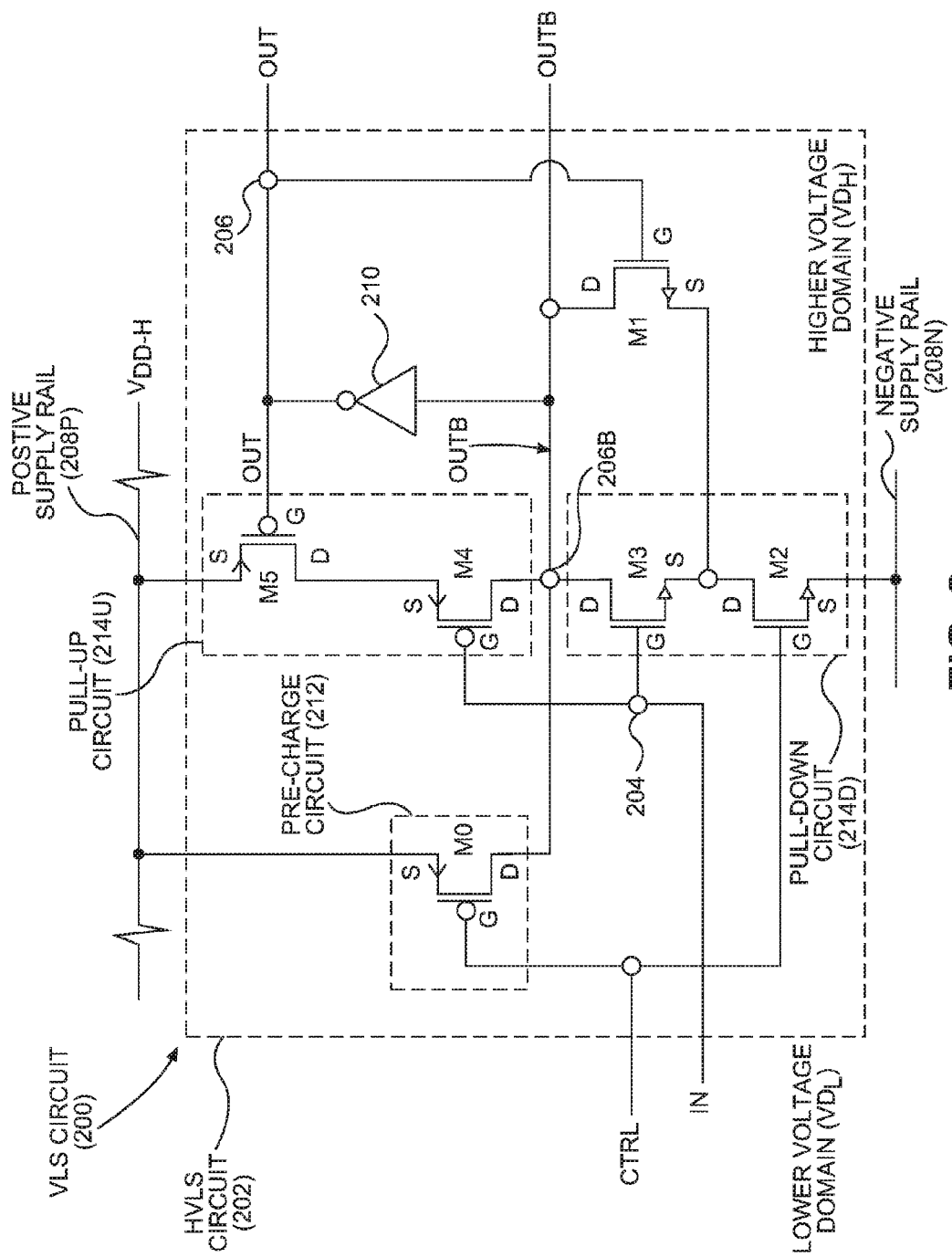
FIG. 2 is a schematic diagram of an exemplary VLS circuit provided in the form of a half-voltage level shifter (HVLS) circuit that includes a stacked N-type (N) metal oxide semiconductor (MOS) (NMOS) transistor pull-down circuit to avoid contention with a pre-charge circuit during a pre-charge phase.
Figure 3:
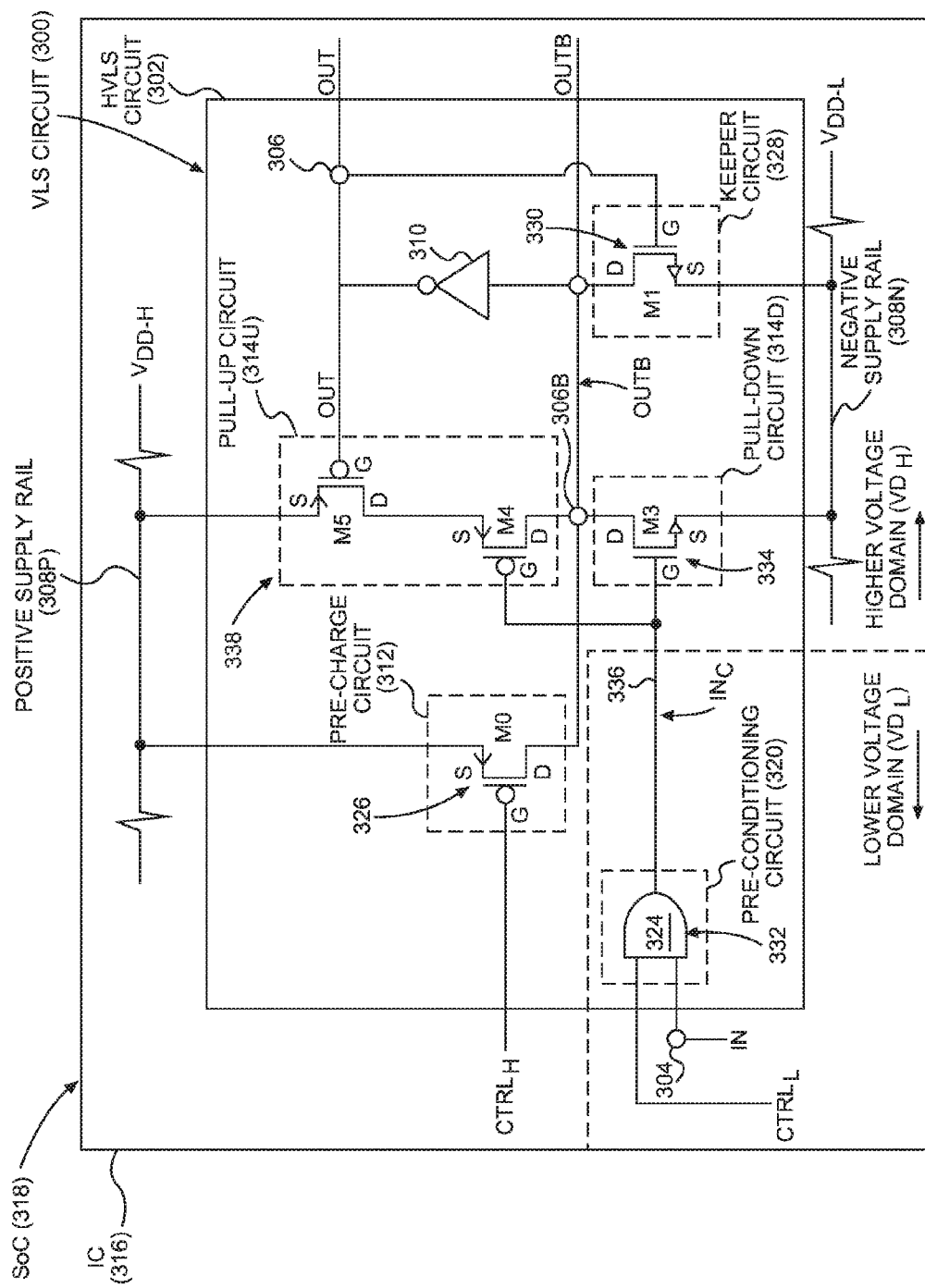
FIG. 3 is a schematic diagram of an exemplary VLS circuit provided in the form of a HVLS circuit configured to pre-condition an input signal on a input node in a lower voltage domain in response to a pre-charge phase to avoid contention between a pull-down circuit and a pre-charge circuit configured to pre-charge an output node in a higher voltage domain during the pre-charge phase.

Before discussing VLS circuits that employ a pre-conditioning circuit for pre-conditioning an input signal to be voltage level shifted in response to a pre-charge phase starting at FIG. 3, a VLS circuit that does not employ a pre-conditioning circuit is first discussed with regard to FIG. 2.

FIG. 2 is a schematic diagram of an exemplary VLS circuit 200 provided in the form of a HVLS circuit 202. The HVLS circuit 202 is configured to receive an input signal IN on an input node 204 in a lower voltage domain $VD_L$ and voltage level shift the input signal IN into an output signal OUTB on an output node 206B in a higher voltage domain $VD_H$. For example, a voltage level of a supply voltage supplying power in the lower voltage domain $VD_L$ may be 0.5 Volts (V), while a voltage level of a supply voltage supplying power in the higher voltage domain $VD_H$ may be 1.0 V. As shown in FIG. 2, the HVLS circuit 202 is powered by higher supply voltage $V_{DD-H}$ received from a first, positive supply rail 208P in the higher voltage domain $VD_H$ to be able to generate the output signal OUTB in the higher voltage domain $VD_H$. The output signal OUTB is a complement voltage logic state from the input signal IN, but the HVLS circuit 202 can include an inverter circuit 210 that inverts the output signal OUTB to output signal OUT on an output node 206 having the same logic state as the input signal IN. For example, using the supply voltage example above, if the input signal IN were 0.5 V, meaning a logic high or '1' state in the lower voltage domain $VD_L$, the HVLS circuit 202 will generate the output signal OUT at approximately 1.0 V as a logic high or '1' state in the higher voltage domain $VD_H$.

The HVLS circuit 202 is a dynamic voltage level shifter circuit meaning that the output signal OUTB is generated on the output node 206B in an evaluation phase after pre-charging of the output node 206B in a pre-charge phase. In this regard, the HVLS circuit 202 includes a pre-charge circuit 212 coupled to the output node 206B and the positive supply rail 208P. The pre-charge circuit 212 is a PMOS transistor M0. The pre-charge circuit 212 is configured to couple the positive supply rail 208P to the output node 206B to pre-charge the output node 206B to the higher supply voltage VDD-H in response to a pre-charge control signal CTRL indicating a pre-charge state. For example, the pre-charge control signal CTRL may be a clock signal wherein the pre-charge state is indicated by a logic low/'0' value. By the pre-charge circuit 212 pre-charging the output node 206B, this is what is meant by "half-voltage" level shifter. If the logic state of the input signal IN is a low logic state, the output node 206B is already pre-charged to the high logic state. Thus, in an evaluation phase when the pre-charge control signal CTRL is in a high logic state, a pull-up circuit 214U only has to pull-up the voltage level at the output node 206 to the higher supply voltage VDD-H in the evaluation phase from the pre-charged voltage level at the output node 206B during the pre-charge phase to generate the voltage level shifted output signal OUTB at the higher voltage domain VDH. However, if the logic state of the input signal IN is a high logic state during an evaluation phase, a pull-down circuit 214D pulls the output node 206B down to a second, negative supply rail 208N to generate the voltage level shifted output signal OUTB in a logic low state in the higher voltage domain VDH.

The HVLS circuit 202 also includes an NMOS transistor M1 that is provided as an optional keeper circuit. The NMOS transistor M1 keeps the output node OUTB in a low logic state if the input signal IN is in a low logic state on a next evaluation phase, so that the pre-charge circuit 212 does not pre-charge the output node OUTB in the next evaluation phase.

With continuing reference to FIG. 2, to prevent or mitigate the pull-down circuit 214D being active and pulling down the output node 206B to the negative supply rail 208N in contention with the pre-charge circuit 212 pre-charging the output node 206B in the higher supply voltage VDD-H in the pre-charge phase, the pull-down circuit 214D includes stacked NMOS transistors M2 and M3. NMOS transistor M2 is turned off by the pre-charge control signal CTRL in the pre-charge state, which as discussed above causes the pre-charge circuit 212 to be activated to pre-charge the output node 206B to the higher supply voltage VDD-H. The pull-down circuit 214D also includes NMOS transistor M3 that pulls the output node 206B down to the negative supply rail 208N in response to the logic state of the input signal IN being a high logic state during the evaluation phase. The pull-up circuit 214U includes PMOS transistor M4 that is configured to be activated in response to the input signal IN being in a low logic state to pull-up the output node 206B to generate the output signal OUTB in a high logic state in the evaluation phase. Because the PMOS transistor M4 is in the higher voltage domain VDH and the input signal IN is the lower voltage domain VDL, due to this voltage difference, the PMOS transistor M4 may not completely turn off in response to the input signal IN being in a high logic state. Thus, this can cause contention between the pull-up circuit 214U and the pull-down circuit 214D, because the NMOS transistor M3 must overcome the pull-up PMOS transistor M4 to drive the output node 206B lower in response to the input signal IN being in a logic high state. Thus, PMOS transistor M5 is provided in the pull-up circuit 214U and controlled by the output signal OUT on the output node 206 to turn off the PMOS transistor M5 and prevent a crow-bar condition between the positive supply rail 208P and the negative supply rail 208N because of the contention between the NMOS transistor M3 and the PMOS transistor M4.

The critical margin that affects the functionality of the HVLS circuit 202 is the ratio of the pull-down strength of the pull-down circuit 214D through NMOS transistors M2 and M3 to the pull-up strength of the pull-up circuit 214U through PMOS transistors M4 and M5. The pull-down strength must be higher than the pull-up strength. At an extreme voltage difference between the lower and higher voltage domains $VD_L$ and $VD_H$, the pull-down path to the negative supply rail 208N is weakened relative to the pull up path to the positive supply rail 208P, thereby affecting the voltage range where the HVLS circuit 202 works reliably. To improve the operating voltage range of the HVLS circuit 202, the drive strength of the pull-down NMOS transistors M2 and M3 is increased by the size of the pull-down NMOS transistors M2 and M3 and providing such with gates having lower threshold voltages Vt relative to the pull-up PMOS transistors M4 and M5. In some cases, the pull-up circuit 214U may be further stacked to reduce its drive strength. Another circuit may be provided to temporarily weaken the pull-up circuit 214U using a timed signal to assist the pull-down circuit 214D in overpowering the pull-up path of the pull-up circuit 214U to the positive supply rail 208P. However, all of these techniques negatively affect the power/performance/area (PPA) of the HVLS circuit 202 in an undesired manner.

FIG. 3 is a schematic diagram of an exemplary VLS circuit 300 also provided in the form of a HVLS circuit 302. The HVLS circuit 302 is also configured to receive an input signal IN on a node 304 in a first, lower voltage domain $VD_L$, and voltage level shift the input signal IN into an output signal OUTB on an output node 306B in a second, higher voltage domain $VD_H$. As will be discussed in more detail below, unlike the HVLS circuit 202 in FIG. 2, the HVLS circuit 302 in FIG. 3 includes a pre-conditioning circuit 320 in this example. However, the pre-conditioning circuit 320 could also be provided as a separate circuit outside of the HVLS circuit 302, including in a different circuit block for example. The pre-conditioning circuit 320 avoids or mitigates contention between a pre-charge circuit 312 and a pull-down circuit 314D without the need to provide a stacked transistor arrangement in the pull-down circuit 314D, unlike, for example, the pull-down circuit 214D in the HVLS circuit 202 in FIG. 2.

In this example, the pre-conditioning circuit 320 is provided in the form of an AND-based logic circuit 332, which in this non-limiting example is an AND gate 324. The pre-conditioning circuit 320 is configured to receive the input signal IN and a pre-condition control signal $CTRL_L$ in the lower voltage domain $VD_L$. The pre-conditioning circuit 320 is configured to generate a pre-conditioned input signal $IN_C$ in the lower voltage domain $VD_L$ in response to a pre-charge state of the pre-condition control signal $CTRL_L$. In a pre-charge state, a pre-charge control signal $CTRL_H$ in the higher voltage domain $VD_H$ is in a charge logic state, which is a lower voltage or '0' logic state in this example. In this example, the pre-charge control signal $CTRL_H$ follows the logic state of the pre-condition control signal $CTRL_L$. For example, the pre-charge control signal $CTRL_H$ may be the pre-condition control signal $CTRL_L$ shifted to or otherwise available in the higher voltage domain $VD_H$. When the pre-charge control signal $CTRL_H$ is in a charge logic state, the pre-charge circuit 312 is turned on to couple a positive supply rail 308P to the output node 306B. However, when the pre-charge control signal $CTRL_H$ is in a charge logic state, the pre-conditioning circuit 320 forces the pre-conditioned input signal $IN_C$ to the charge logic state regardless of the logic state of the input signal IN, which turns off the NMOS transistor M3 in the pull-down circuit 314D to decouple a negative supply rail 308N (e.g., which may be coupled to ground) from the output node 306B. In this manner, the pre-conditioning circuit 320 mitigates or avoids contention between the pre-charge circuit 312 and the pull-down circuit 314D during the pre-charge phase of the HVLS circuit 302.

For example, this avoids the need to provide a stacked NMOS transistor arrangement or additional transistor in the pull-down circuit 314D, unlike in the pull-down circuit 214D in the HVLS circuit 202 in FIG. 2 for example, to decouple the output node 306B from the negative supply rail 308N during a pre-charge phase. In this example, the pull-down circuit 314D only includes one (1) NMOS transistor, which is NMOS transistor M3. Thus, as an example, the HVLS circuit 302 is capable of operating at more extreme voltage differences between the lower and higher voltage domains $VD_H$ and $VD_L$, because of the ratio of the pull-down strength of the pull-down circuit 314D through NMOS transistor M3 to the pull-up strength of a pull-up circuit 314U through PMOS transistors M4 and M5. The absence of an additional NMOS transistor in the pull-down circuit 314D does not further weaken the pull-down path to the negative supply rail 308N relative to the pull up path to the positive supply rail 308P such that the drive strength of the pull-down circuit 314D must be increased and/or providing the gate G of the NMOS transistor M3 with lower threshold voltage Vt relative to pull-up PMOS transistors M4 and M5.

With continuing reference to FIG. 3, the HVLS circuit 302 can be provided in an integrated circuit (IC) 316 that may, for example, be provided in a system-on-a-chip (SoC) 318 with an integrated processor and memory systems. The HVLS circuit 302 is powered by a higher supply voltage $V_{DD\text{-}H}$ received from the first, positive supply rail 308P in the higher voltage domain $VD_H$ to be able to generate the output signal OUTB in the higher voltage domain $VD_H$. For example, a voltage level of a supply voltage supplying power in the lower voltage domain $VD_L$ may be 0.5 Volts (V), while a voltage level of a supply voltage supplying power in the higher voltage domain $VD_H$ may be 1.0 V. The output signal OUTB is a complement voltage logic state from the pre-conditioned input signal $IN_C$, but the HVLS circuit 302 can include an inverter circuit 310 that inverts the output signal OUTB to output signal OUT on output node 306 having the same logic state as the input signal IN and the pre-conditioned input signal $IN_C$. For example, using the supply voltage example above, if the input signal IN were 0.5 V, meaning a logic high or '1' state in the lower voltage domain $VD_L$, the HVLS circuit 302 will generate the output signal OUT at approximately 1.0 V as a logic high or '1' state in the higher voltage domain $VD_H$.

The HVLS circuit 302 is a dynamic voltage level shifter circuit meaning that the output signal OUTB is generated on the output node 306B in an evaluation phase after pre-charging of the output node 306B in a pre-charge phase. In this regard, the HVLS circuit 302 includes a pre-charge circuit 312 coupled the output node 306B and the positive supply rail 308P. The pre-charge circuit 312 is a PMOS logic circuit 326 in this example, which is PMOS transistor M0 in this example. The pre-charge circuit 312 is configured to couple the positive supply rail 308P to the output node 306B to pre-charge the output node 306B to the higher supply voltage $V_{DD\text{-}H}$ in response to the pre-charge control signal $CTRL_H$ indicating a pre-charge state. For example, the pre-charge control signal $CTRL_H$ may be a clock signal wherein the pre-charge state is indicated by a logic low/'0' value. By the pre-charge circuit 312 pre-charging the output node 306B, this is what is meant by a "half-voltage" level shifter. If the logic state of the input signal IN is a low logic state, the output node 306B is already pre-charged to the high logic state. Thus, in an evaluation phase when the pre-charge control signal $CTRL_H$ is in a high logic state, the pull-up circuit 314U only has to pull-up the voltage level at the output node 306 to the higher supply voltage $V_{DD\text{-}H}$ in the evaluation phase from the pre-charged voltage level at the output node 306B during the pre-charge phase to generate the voltage level shifted output signal OUTB at the higher voltage domain $VD_H$. However, if the logic state of the input signal IN is a high logic state during an evaluation phase, the pull-down circuit 314D pulls the output node 306B down to the second, negative supply rail 308N to generate the voltage level shifted output signal OUTB in a logic high state in the higher voltage domain $VD_H$.

With continuing reference to FIG. 3, when the pre-charge control signal $CTRL_H$ and the pre-condition control signal $CTRL_L$ is in a discharge logic state, which is a higher voltage level or logic '1' state in this example, the HVLS circuit 302 is in an evaluation phase. In this manner, with the pre-conditioning circuit 320 being an AND gate 324 in this example, the pre-conditioning circuit 320 passes the actual logic state of the input signal IN as the pre-conditioned input signal $IN_C$ to the pull-up circuit 314U and the pull-down circuit 314D. In this manner, depending on the logic state of the pre-conditioned input signal $IN_C$, the pull-up circuit 314U will pull up the output node 306 to the higher voltage level $V_{DD\text{-}H}$ of the positive supply rail 308P or the pull-down circuit 314D will pull down the output node 306B to the lower voltage level $V_{DD\text{-}L}$ of the negative supply rail 308N to generate the output signal OUTB in the higher voltage domain $VD_H$. If the logic state of the pre-conditioned input signal $IN_C$ is in the charge logic state in the evaluation phase, which is a lower voltage level or logic '0' state in example, the PMOS transistor M4 of the pull-up circuit 314U will be turned on to couple to the positive supply rail 308P to the output node 306B, and the NMOS transistor M3 of the pull-down circuit 314D will be turned off to decouple the negative supply rail 308N from the output node 306B. On the other hand, if the logic state of the pre-conditioned input signal $IN_C$ is in the discharge logic state in the evaluation phase, which is a higher voltage level or logic '1' state in example, the PMOS transistor M4 of the pull-up circuit 314U will be turned off to decouple the positive supply rail 308P from the output node 306B, and the NMOS transistor M3 of the pull-down circuit 314D will be turned on to couple the negative supply rail 308N to the output node 306B.

With continuing reference to FIG. 3, the pull-down circuit 314D in this example includes an NMOS logic circuit 334 which is the NMOS transistor M3 in this example. A gate G of the NMOS transistor M3 is coupled to a pre-conditioned input node 336 that carries the pre-conditioned input signal $IN_C$ generated by the pre-conditioning circuit 320. A first, source electrode S of the NMOS transistor M3 is coupled to the negative supply rail 308N. A second, drain electrode D of the NMOS transistor M3 is coupled to the output node 306B. By the gate G of the NMOS transistor M3 being coupled to the pre-conditioned input node 336, the pre-conditioned input signal $IN_C$ being in a discharge logic state will turn on the NMOS transistor M3 in an evaluation phase to pull-down and couple the output node 306B to the negative supply rail 308N to generate the voltage level shifted output signal OUTB in the higher voltage domain $VD_H$. As discussed above, if the HVLS circuit 302 is in a pre-charge phase where the pre-charge control signal $CTRL_H$ is in a charge logic state to turn on the pre-charge circuit 312 to couple the output node 306B to the higher supply voltage $V_{DD-H}$ of the positive supply rail 308P, the pre-conditioned input signal $IN_C$ will turn off the NMOS transistor M3 regardless of the logic state of the input signal IN.

With continuing reference to FIG. 3, the pull-up circuit 314U in this example includes a PMOS logic circuit 338 provided in the form of a stacked PMOS transistor circuit. The PMOS logic circuit 338 includes the PMOS transistor M4 and the PMOS transistor M5 coupled together in a stacked arrangement in this example. A gate G of the PMOS transistor M4 is coupled to the pre-conditioned input node 336 that carries the pre-conditioned input signal $IN_C$ generated by the pre-conditioning circuit 320. A first, source electrode S of the PMOS transistor M4 is coupled to a second, drain electrode D of the second PMOS transistor M5 in the pull-up circuit 314U. A gate G of the PMOS transistor M5 is coupled to the output node 306. A first, source electrode S of the PMOS transistor M5 is coupled to the positive supply rail 308P. By the gate G of the PMOS transistor M4 being coupled to the pre-conditioned input node 336, the pre-conditioned input signal $IN_C$ being in a charge logic state will turn on the PMOS transistor M4 in an evaluation phase to pull-up and couple the output node 306B to the positive supply rail 308P to generate the voltage level shifted output signal OUTB in the higher voltage domain $VD_H$. The gate G of the PMOS transistor M5 is controlled by the output signal OUT on the output node 306 to turn off the PMOS transistor M5 and prevent a crow-bar condition between the positive supply rail 308P and the negative supply rail 308N because of the contention between the NMOS transistor M3 and the PMOS transistor M4.

The HVLS circuit 302 also includes an optional keeper circuit 328, which is an NMOS logic circuit 330 in this example. The NMOS logic circuit 330 in this example is an NMOS transistor M1. A gate G of the NMOS transistor M1 is coupled to the output node 306. A first, source electrode S of the NMOS transistor M1 is coupled to the negative supply rail 308N. A second, drain electrode D of the NMOS transistor M1 is coupled to the output node 306B. The NMOS transistor M1 is configured to "keep" or maintain the coupling of the output node 306B to the negative supply rail 308N to keep the output node 306B in the discharge logic state if the input signal IN is in a discharge logic state on the next evaluation phase, so that the pre-charge circuit 312 does not pre-charge the output node OUTB in the next evaluation phase. The discharge logic state is maintained on the output node 306B until the next evaluation phase in which the input signal IN, and thus the output node 306B, are in the charge logic state.

Figure 4:
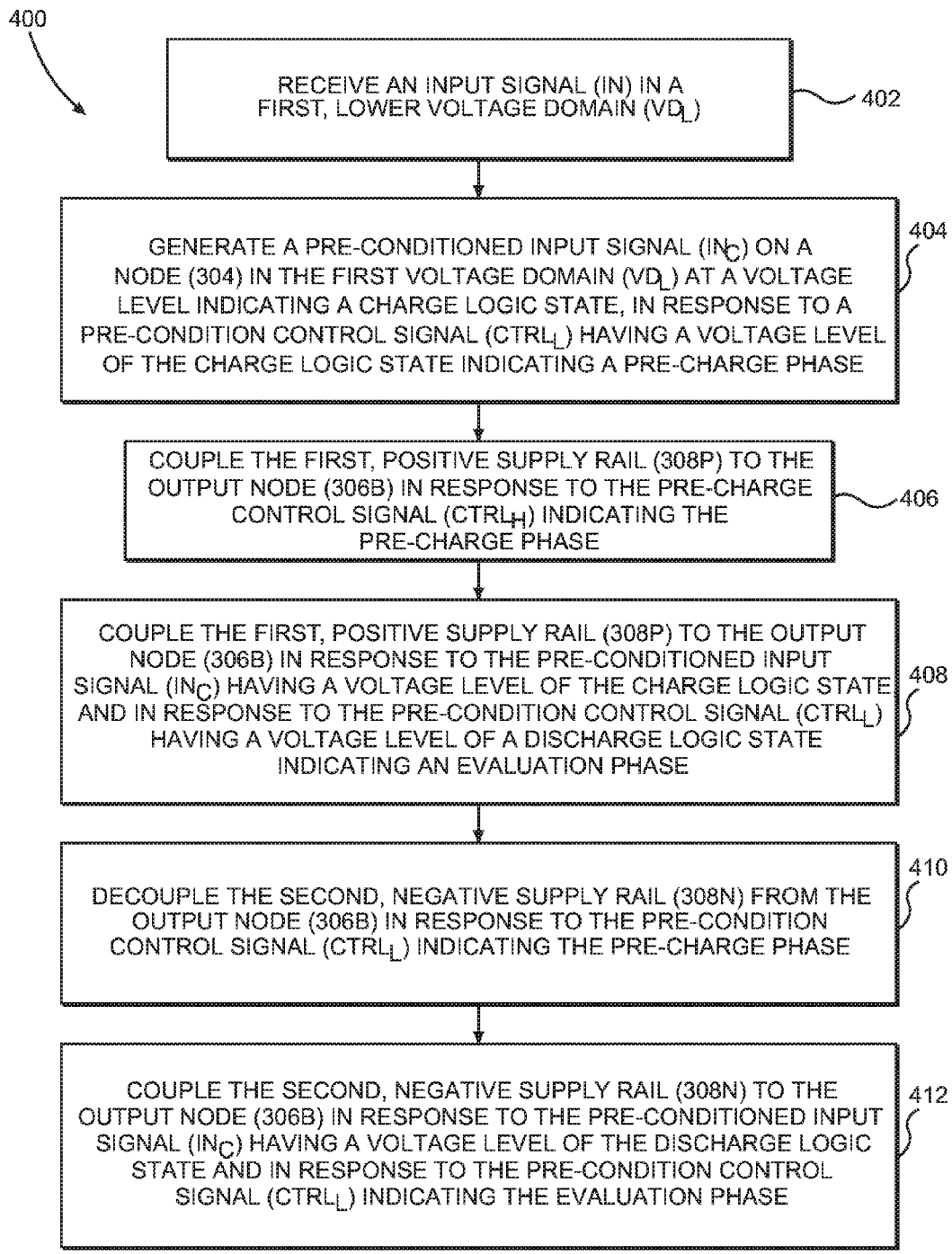
FIG. 4 is a flowchart illustrating an exemplary process of the HVLS circuit in FIG. 3 pre-conditioning the input signal on the input node in response to the pre-charge phase to avoid contention between the pull-down circuit and the pre-charge circuit, and voltage level shifting the input signal in the lower voltage domain to a voltage level-shifted output signal in the higher voltage domain during an evaluation phase.

FIG. 4 is a flowchart illustrating an exemplary process 400 of the HVLS circuit 302 in FIG. 3 pre-conditioning the input signal IN in response to the pre-charge phase to avoid contention between the pull-down circuit 314D and the pre-charge circuit 312. In this regard, as illustrated in FIG. 4, the process 400 includes the pre-conditioning circuit 320 receiving the input signal IN in the first, lower voltage domain $VD_L$ (block 402). The process 400 also includes the pre-conditioning circuit 320 generating the pre-conditioned input signal $IN_C$ on the node 304 in the first, lower voltage domain $VD_L$ at a voltage level indicating a charge logic state, in response to the pre-condition control signal $CTRL_L$ having a voltage level of a charge logic state indicating a pre-charge phase (block 404). The process 400 also includes coupling the first, positive supply rail 308P to the output node OUTB in response to the pre-charge control signal $CTRL_H$ indicating the pre-charge phase (block 406). The process 400 also includes coupling the first, positive supply rail 308P to the output node OUTB in response to the pre-conditioned input signal $IN_C$ having a voltage level of a charge logic state, and in response to the pre-condition control signal $CTRL_L$ having a voltage level of a discharge logic state indicating an evaluation phase (block 408). The process 400 also includes decoupling the second, negative supply rail 308N from the output node 306B in response to the pre-condition control signal $CTRL_L$ indicating the pre-charge phase (block 410). The process 400 also includes coupling the second, negative supply rail 308N to the output node OUTB in response to the pre-conditioned input signal $IN_C$ having a voltage level of a discharge logic state, and in response to the pre-condition control signal $CTRL_L$ indicating the evaluation phase (block 412).

Figure 5:
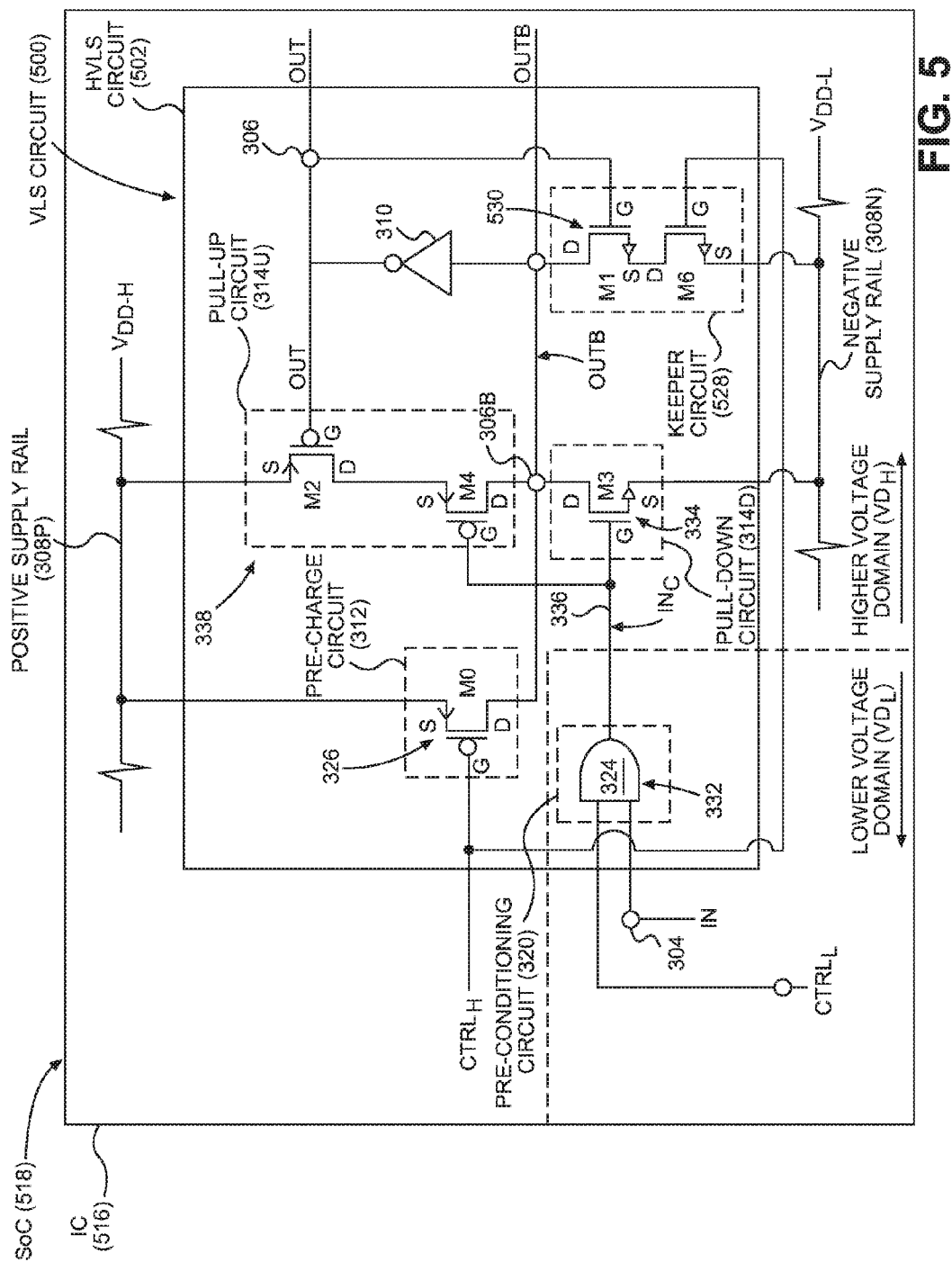
FIG. 5 is a schematic diagram of another exemplary VLS circuit provided in the form of a HVLS circuit configured to pre-condition an input signal on an input node in a lower voltage domain in response to a pre-charge phase, and which additionally includes a stacked NMOS pull-down circuit configured to pull-down the output node in the higher voltage domain in response to the signal level of the voltage level-shifted signal on the output node and the pre-charge phase.

Other variations of the HVLS circuit 302 in FIG. 3 can be provided that are also configured to pre-condition an input signal IN in a lower voltage domain $VD_L$ in response to the pre-charge phase to avoid contention between a pull-down circuit and a pre-charge circuit in a higher voltage domain $VD_H$. In this regard, FIG. 5 is a schematic diagram of another exemplary VLS circuit 500 also provided in the form of a HVLS circuit 502. The HVLS circuit 502 can be provided in an IC 516 that may, for example, be provided in a SoC 518 with an integrated processor and memory systems. The HVLS circuit 502 in FIG. 5 includes some common components with the HVLS circuit 302 in FIG. 3, which are shown with common element numbers between FIGS. 3 and 5. Thus, these common components will not be re-described.

The HVLS circuit 502 in FIG. 5 includes an optional keeper circuit 528 that is similar to the keeper circuit 328 in the HVLS circuit 302 in FIG. 3. The keeper circuit 528 is an NMOS logic circuit 530. In addition to the NMOS transistor M1 being coupled to the output node OUTB, the NMOS logic circuit 530 includes an additional second NMOS transistor M6. The source electrode S of the NMOS transistor M1 is coupled to a first, drain electrode D of the NMOS transistor M6. A second, source electrode S of the NMOS transistor M6 is coupled to the negative supply rail 308N. The gate G of the NMOS transistor M6 is coupled to the pre-charge control signal $CTRL_H$. Thus, the NMOS transistor M6 is turned on when the pre-charge control signal $CTRL_H$ is in the discharge logic state in this example indicating the evaluation phase, to "keep" or maintain a coupling of the output node 306B to the negative supply rail 308N to keep the output node 306B in the discharge logic state. The output node 306B is maintained coupled to the negative supply rail 308N through the input signal IN subsequently being in a charge state until the pre-charge control signal $CTRL_H$ indicates the pre-charge phase causing the pre-charge circuit 312 to pre-charge the output node 306B.

Figure 6:
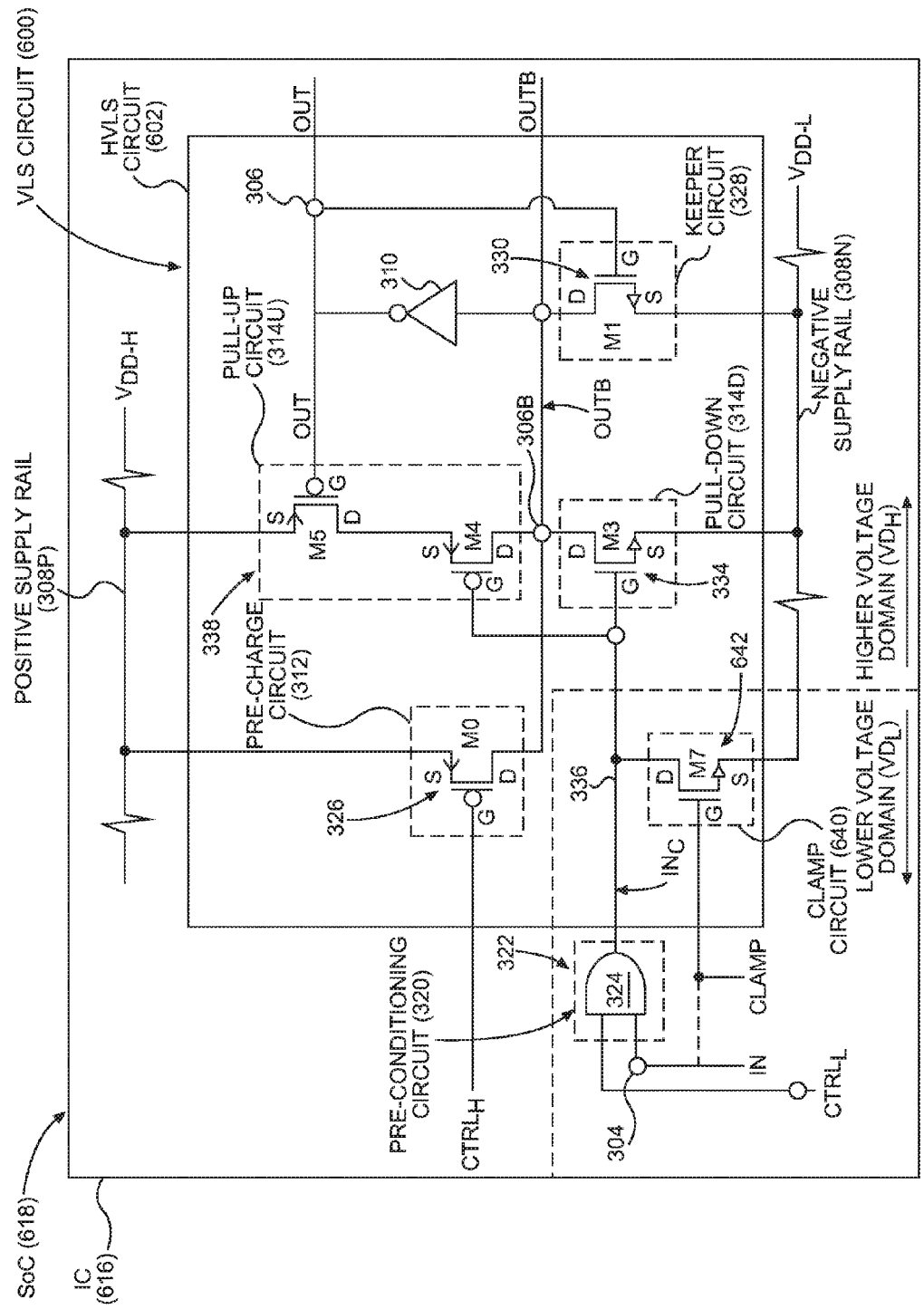
FIG. 6 is a schematic diagram of another exemplary VLS circuit provided in the form of a HVLS circuit configured to pre-condition an input signal on an input node in a lower voltage domain in response to a pre-charge phase, and which additionally includes a clamp circuit configured to clamp the input node in response to a collapse state.

FIG. 6 is a schematic diagram of another exemplary VLS circuit 600 also provided in the form of a HVLS circuit 602. The HVLS circuit 602 can be provided in an IC 616 that may for example, be provided in a SoC 618 with an integrated processor and memory systems. The HVLS circuit 602 in FIG. 6 includes some common components with the HVLS circuit 302 in FIG. 3, which are shown with common element numbers between FIGS. 3 and 6. Thus, these common components will not be re-described.

The HVLS circuit 602 in FIG. 6 includes an optional clamp circuit 640 that is similar to the keeper circuit 328 in the HVLS circuit 302 in FIG. 3. The clamp circuit 640 is provided as an NMOS logic circuit 642 in this example. The NMOS logic circuit 642 includes an NMOS transistor M7. The clamp circuit 640, and more particularly the gate G of the NMOS transistor M7, is coupled to a clamp control signal CLAMP. The clamp circuit 640, and more particularly the source electrode S of the NMOS transistor M7, is coupled to the negative supply rail 308N. The clamp circuit 640, and more particularly the drain electrode D of the NMOS transistor M7, is coupled to the input node 336. The clamp circuit 640 is configured to pull down the input node 336 to the negative supply rail 308N, or alternatively the node 304, in response to the clamp control signal CLAMP indicating a clamp state, which is a high voltage level or '1' logic state in this example. In this manner, the pull-down circuit 314D will not be turned on or switch as long as the clamp control signal CLAMP is asserted having the clamp state. For example, the clamp control signal CLAMP may be asserted by the clamp state when it is desired to collapse the node 304, such as when it is desired to put the HVLS circuit 302 in an idle or collapsed power mode to conserve power. The clamp control signal CLAMP being asserted by the clamp state prevents the output node 306B from being driven to different states. When it is desired to no longer clamp the HVLS circuit 602, the clamp control signal CLAMP can be driven to a non-clamping state, which is a low voltage level or '0' logic level in this example.

Figure 7:
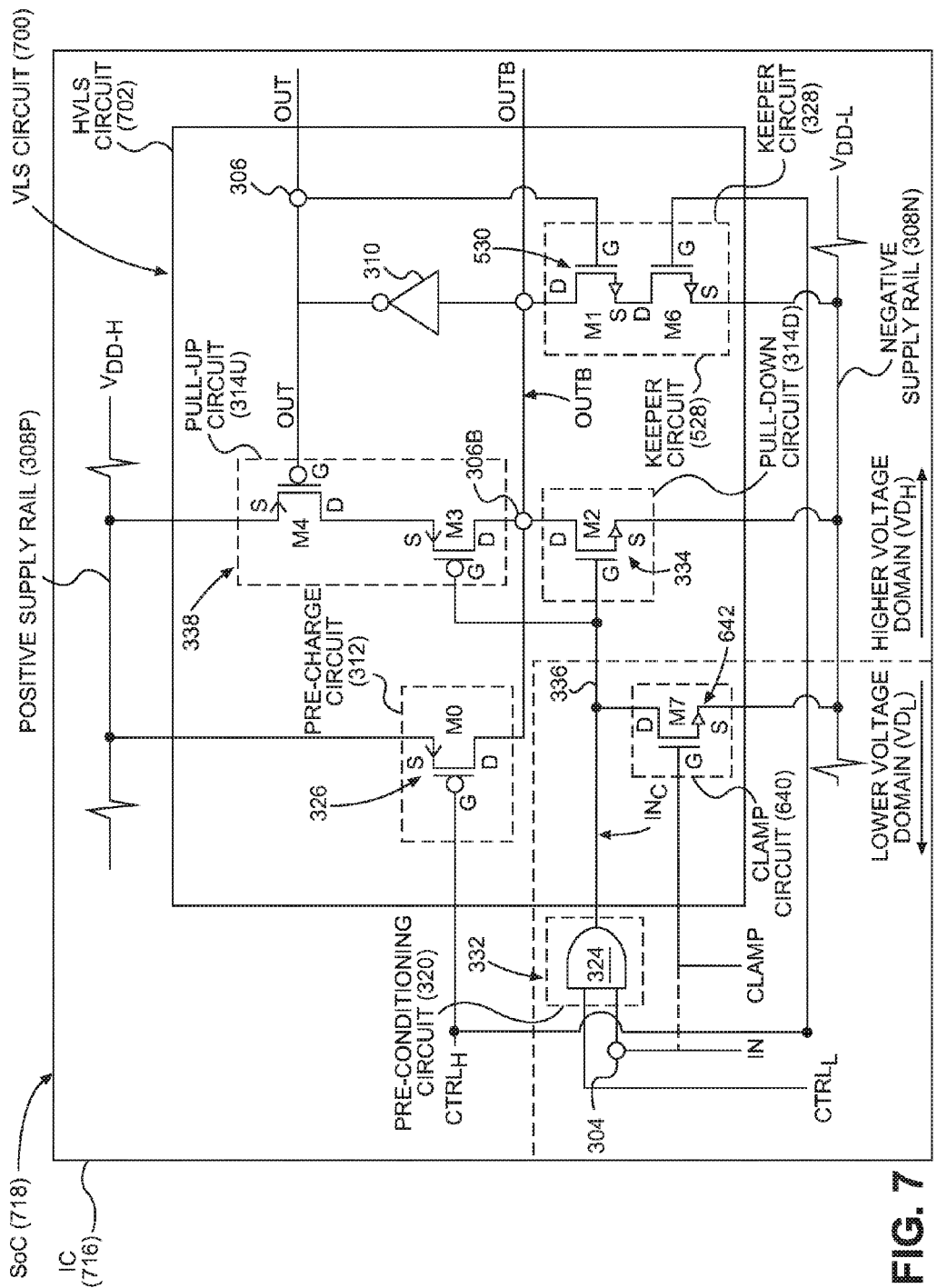
FIG. 7 is a schematic diagram of another exemplary VLS circuit provided in the form of a HVLS circuit configured to pre-condition an input signal on an input node in a lower voltage domain in response to a pre-charge phase, and which additionally includes the stacked NMOS pull-down circuit in the HVLS in FIG. 5 configured to pull-down the output node in the higher voltage domain in response to the signal level of the voltage level-shifted signal on the output node and the pre-charge phase, and the clamp circuit in the HVLS in FIG. 6 configured to clamp the input node in response to a collapse state.

FIG. 7 is a schematic diagram of another exemplary VLS circuit 700 also provided in the form of a HVLS circuit 702. The HVLS circuit 702 can be provided in an IC 716 that may for example, be provided in a SoC 618 with an integrated processor and memory systems. The HVLS circuit 702 includes both the clamp circuit 640 in the HVLS circuit 602 in FIG. 6 and the keeper circuit 528 in the HVLS circuit 502 in FIG. 5. The common components between the HVLS circuit 702 in FIG. 7 and the HVLS circuits 502, 602 in FIGS. 5 and 6 are shown with common element numbers between FIGS. 5, 6, and 7, which have been described above. Thus, these common components and their functionality do not need to be re-described.

In another aspect, a VLS circuit can be provided that employs a pre-conditioning circuit for pre-conditioning an input signal to be voltage level shifted in response to a pre-charge phase to prevent or mitigate contention between a pre-charge circuit and a pull-down circuit. These VLS circuit can include, for example, any of the HVLS circuits 302, 502, 602, 702 in FIGS. 3 and 5-7, or any portion of any components provided therein. Note that these components can be provided in either NMOS or PMOS logic. These VLS circuits can include a means for receiving an input signal in a first voltage domain. These VLS circuits can also include a means for generating a pre-conditioned input signal in the first voltage domain at a voltage level on an input node indicating a charge logic state, in response to a pre-condition control signal having a voltage level of the charge logic state indicating a pre-charge phase. These VLS circuits can also include a means for coupling a first supply rail of a supply voltage relative to a second supply rail in a second voltage domain higher than the first voltage domain to an output node in response to a pre-charge control signal indicating the pre-charge phase. These VLS circuits can also include a pull-up means for coupling the first supply rail to the output node in response to the pre-conditioned input signal having a voltage level of the charge logic state, and in response to the pre-condition control signal having a voltage level of a discharge logic state indicating an evaluation phase. These VLS circuits can also include a pull-down means that includes a means for decoupling the second supply rail from the output node in response to the pre-condition control signal indicating the pre-charge phase, and a means for coupling the second supply rail to the output node in response to the pre-conditioned input signal having a voltage level of the discharge logic state, and in response to the pre-condition control signal indicating the evaluation phase. The pull-up means in these VLS circuits can also include a means for decoupling the first supply rail from the output node in response to the pre-conditioned input signal having a voltage level of the discharge logic state, and in response to the pre-condition control signal indicating the evaluation phase. The pull-down means in these VLS circuits can also include a means for decoupling the second supply rail from the output node in response to the pre-conditioned input signal having a voltage level of the charge logic state, and in response to the pre-condition control signal indicating the evaluation phase.

Figure 8:
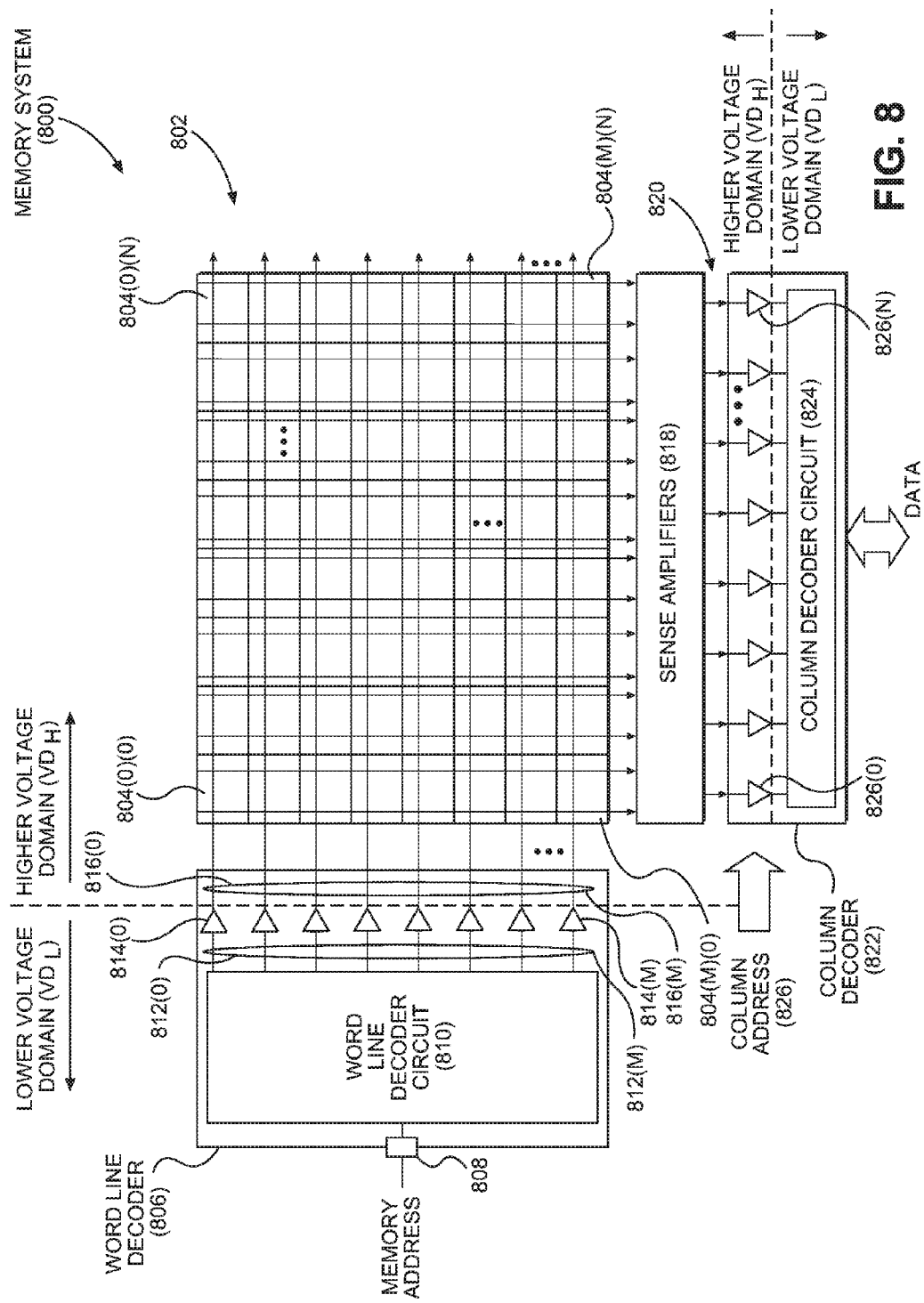
FIG. 8 is a schematic diagram of an exemplary memory system that includes multiple voltage domains including a lower voltage domain and a higher voltage domain, and that includes a word line decoder that includes VLS circuits employing a pre-conditioning circuit for pre-conditioning an input signal to be voltage level shifted in response to a pre-charge phase to prevent or mitigate contention between a pre-charge circuit and a pull-down circuit, including but not limited to the HVLS circuits in FIGS. 3, 5, 6, and 7.

Further, the VLS circuits described above can be included in any circuit or system that has multiple voltage domains and needs to shift signals in a lower voltage domain to a higher voltage domain, or vice versa. In this regard, FIG. 8 is a schematic diagram of an exemplary multiple voltage domain memory system 800 ("memory system 800") that includes a lower voltage domain $VD_L$ and a higher voltage domain $VD_H$. The memory system 800 includes a memory array 802 provided in the higher voltage domain $VD_H$ for data retention. The memory array 802 includes a plurality of memory bit cells 804(0)(0)-804(M)(N) organized in rows and columns, where 'M' indicates the memory row and 'N' indicates the memory column. Each of the memory bit cells 804(0)(0)-804(M)(N) is configured to store data. To access the memory bit cells 804(0)(0)-804(M)(N) during a memory access operation (i.e., a read or write operation), a word line decoder 806 is provided. The word line decoder 806 includes an address input interface 808 configured to receive a memory address associated with a memory row in the memory array 802 to be addressed. The address input interface 808 is in the lower voltage domain $VD_L$ in this example.

The word line decoder 806 also includes a word line decoder circuit 810 in the lower voltage domain $VD_L$ configured to receive the memory address and decode the memory address into a decoded word comprising a plurality of word line bit signals 812(0)-812(M). Because the word line bit signals 812(0)-812(M) are in the lower voltage domain $VD_L$ and the memory array 802 is in the higher voltage domain $VD_H$, a plurality of VLS circuits 814(0)-814(M) are each coupled to a word line 812(0)-812(M) among the plurality of word lines bits 812(0)-812(M). Note that the VLS circuits 814(0)-814(M) are shown outside of the word line decoder 806, but the VLS circuits 814(0)-814(M) can be provided within the word line decoder 806. Further note that the pre-conditioning circuits 320 described above that are shown as part of the VLS circuits 300, 500, 600, and 700 can be provided separately from the VLS circuits 814(0)-814(M) and also as part of the word line decoder 806. The VLS circuits 814(0)-814(M) can include HVLS circuits that are configured to condition the word lines bits 812(0)-812(M) in the lower voltage domain $VD_L$ to avoid contention between a pull-down circuit and a pre-charge circuit. For example, the VLS circuits 814(0)-814(M) can include any of the HVLS circuits 302, 502, 602, 702 in FIGS. 3 and 5-7 described above as examples, which have already been described and thus do not need to be re-described here. The VLS circuits 814(0)-814(M) are configured to generate output word lines 816(0)-816(M) which are voltage level shifted signals of the respective word line bit signals 812(0)-812(M). Note that only one word line bit signal 812(0)-812(M) may be active at one time as the "hot" word line to select the row of memory bit cells 804(0)( )-804(M)( ) according to the decoded memory address. The active output word line 816(0)-816(M) is asserted in the memory array 802 to activate the memory bit cells 804(0)( )-804(M)( ) in the selected row.

In a read operation, sense amplifiers 818 sense the data of the activated row of memory bit cells 804(0)( )-804(M)( ) to provide read data 820 to a column decoder 822. The column decoder 822 includes a column decoder circuit 824 that is controlled by a column address 825. If the column decoder circuit 824 is in the lower voltage domain $VD_L$, VLS circuits 826(0)-826(N) can be provided to voltage level shift the read data 820 from the higher voltage domain $VD_H$ to the lower voltage domain $VD_L$ to provide the read data 820 in the lower voltage domain $VD_L$ to another circuit.

VLS circuits employing a pre-conditioning circuit for pre-conditioning an input signal to be voltage level shifted in response to a pre-charge phase to prevent or mitigate contention between a pre-charge circuit and a pull-down circuit, including but not limited to the HVLS circuits 302, 502, 602, 702 in FIGS. 3 and 5-7, respectively, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 9:
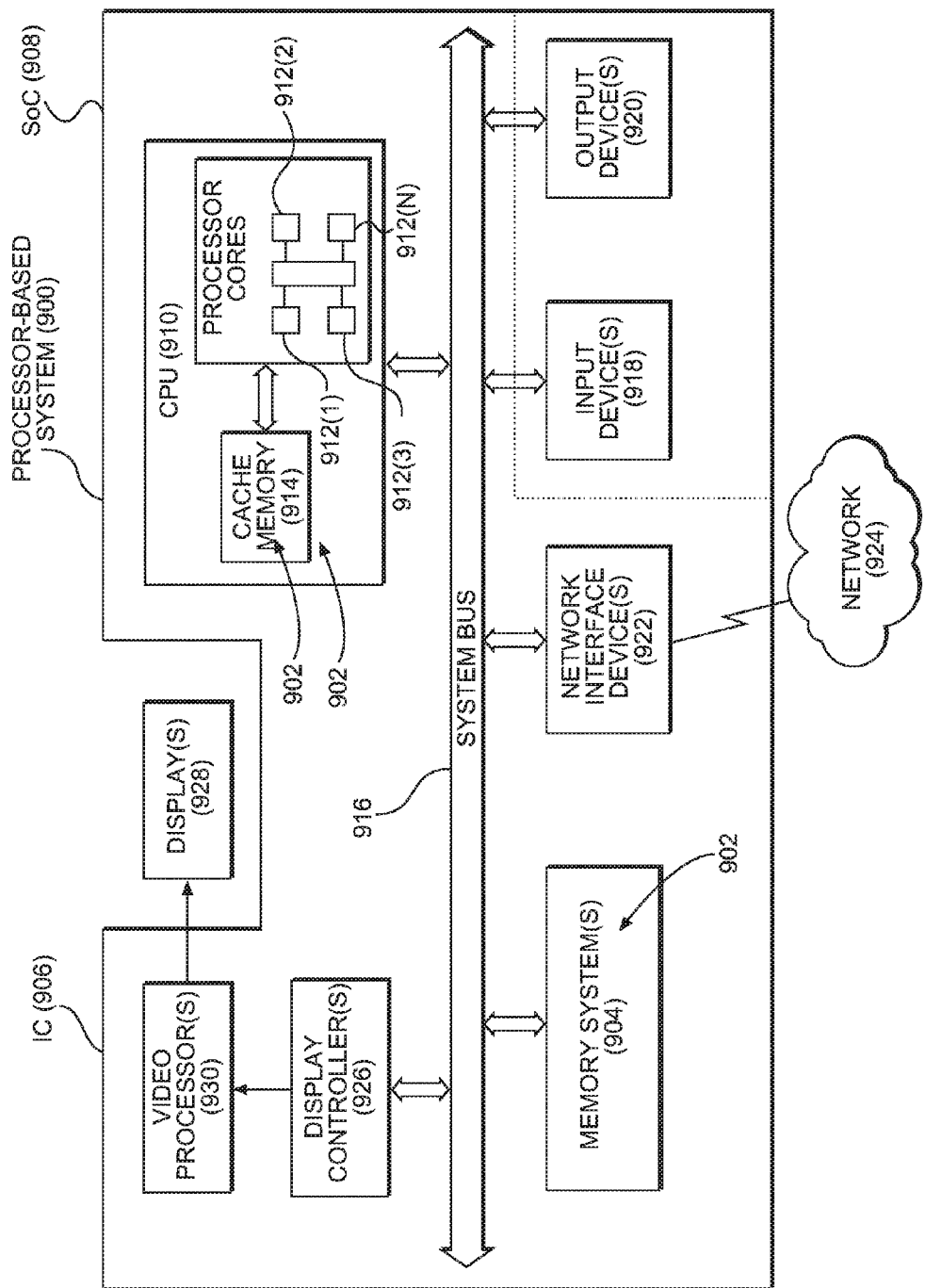
FIG. 9 is a block diagram of an exemplary processor-based system that can include VLS circuits employing a pre-conditioning circuit for pre-conditioning an input signal to be voltage level shifted in response to a pre-charge phase to prevent or mitigate contention between a pre-charge circuit and a pull-down circuit, including but not limited to the HVLS circuits in FIGS. 3, 5, 6, and 7.

In this regard, FIG. 9 illustrates an example of a processor-based system 900 that can include circuits that include VLS circuits 902 employing a pre-conditioning circuit for pre-conditioning an input signal to be voltage level shifted in response to a pre-charge phase to prevent or mitigate contention between a pre-charge circuit and a pull-down circuit, including but not limited to the HVLS circuits 302, 502, 602, 702 in FIGS. 3 and 5-7. For example, the processor-based system 900 includes one or more memory systems 904 provided in a higher voltage domain and/or split between multiple voltage domains, wherein the memory systems 904 can employ VLS circuits 902 employing a pre-conditioning circuit for pre-conditioning an input signal to be voltage level shifted in response to a pre-charge phase to prevent or mitigate contention between a pre-charge circuit and a pull-down circuit. These VLS circuits 902 can include but are not limited to the HVLS circuits 302, 502, 602, 702 in FIGS. 3 and 5-7, as non-limiting examples.

In this example, the processor-based system 900 is provided in an IC 906. The IC 906 may be included in or provided as a SoC 908. The processor-based system 900 includes a CPU or processor 910 that includes one or more processor cores 912(0)-912(N). The CPU 910 may have a cache memory 914 coupled to the processor cores 912(0)-912(N) for rapid access to temporarily stored data. The cache memory 914 may include the VLS circuits 902 employing a pre-conditioning circuit for pre-conditioning an input signal to be voltage level shifted in response to a pre-charge phase to prevent or mitigate contention between a pre-charge circuit and a pull-down circuit. The CPU 910 is coupled to a system bus 916 and can intercouple master and slave devices included in the processor-based system 900. As is well known, the CPU 910 communicates with these other devices by exchanging address, control, and data information over the system bus 916. Although not illustrated in FIG. 9, multiple system buses 916 could be provided, wherein each system bus 916 constitutes a different fabric. For example, the CPU 910 can communicate bus transaction requests to the memory systems 904 as an example of a slave device.

Other master and slave devices can be connected to the system bus 916. As illustrated in FIG. 9, these devices can include the memory systems 904, and one or more input devices 918. The input device(s) 918 can include any type of input device, including but not limited to input keys, switches, voice processors, etc. The other devices can also include one or more output devices 920, and one or more network interface devices 922. The output device(s) 920 can include any type of output device, including but not limited to audio, video, other visual indicators, etc. The network interface device(s) 922 can be any devices configured to allow exchange of data to and from a network 924. The network 924 can be any type of network, including but not limited to a wired or wireless network, a private or public network, a local area network (LAN), a wireless local area network (WLAN), a wide area network (WAN), a BLUETOOTH™ network, and the Internet. The network interface device(s) 922 can be configured to support any type of communications protocol desired.

The other devices can also include one or more display controllers 926 as examples. The CPU 910 may also be configured to access the display controller(s) 926 over the system bus 916 to control information sent to one or more displays 928. The display controller(s) 926 sends information to the display(s) 928 to be displayed via one or more video processors 930, which process the information to be displayed into a format suitable for the display(s) 928. The display(s) 928 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A voltage level shifter (VLS) circuit, comprising:
a pre-conditioning circuit configured to:
receive an input signal in a first voltage domain; and
generate a pre-conditioned input signal on an input node in the first voltage domain at a voltage level on an input node indicating a charge logic state, in response to a pre-condition control signal having a voltage level of the charge logic state indicating a pre-charge phase;
a pre-charge circuit coupled to an output node and a first supply rail of a supply voltage relative to a second supply rail in a second voltage domain higher than the first voltage domain, the pre-charge circuit configured to couple the first supply rail to the output node in response to a pre-charge control signal indicating the pre-charge phase;
a pull-up circuit coupled to the first supply rail and the output node, the pull-up circuit configured to couple the first supply rail to the output node in response to the pre-conditioned input signal having a voltage level of the charge logic state; and
a pull-down circuit coupled to the input node and the second supply rail, the pull-down circuit configured to:
decouple the second supply rail from the output node in response to the pre-condition control signal indicating the pre-charge phase; and
couple the second supply rail to the output node in response to the pre-conditioned input signal having a voltage level of a discharge logic state in response to the pre-condition control signal having the voltage level of the discharge logic state indicating an evaluation phase.

2. The VLS circuit of claim 1, wherein:
the pull-up circuit is further configured to decouple the first supply rail from the output node in response to the pre-conditioned input signal having a voltage level of the discharge logic state in response to the pre-condition control signal indicating the evaluation phase; and
the pull-down circuit is further configured to decouple the second supply rail from the output node in response to the pre-conditioned input signal having a voltage level of the charge logic state.

3. The VLS circuit of claim 1, wherein the pull-down circuit comprises only one transistor, the transistor comprising a gate, a first electrode, and a second electrode, the gate coupled to the input node, the first electrode coupled to the second supply rail, and the second electrode coupled to the output node.

4. The VLS circuit of claim 1, wherein the pull-down circuit comprises an N-type (N) metal oxide semiconductor (MOS) (NMOS) circuit.

5. The VLS circuit of claim 4, wherein the NMOS circuit comprises an NMOS transistor comprising a gate, a first electrode, and a second electrode, the gate coupled to the input node, the first electrode coupled to the second supply rail, and the second electrode coupled to the output node.

6. The VLS circuit of claim 1, wherein the pull-up circuit comprises a P-type (P) MOS (PMOS) circuit.

7. The VLS circuit of claim 6, wherein the PMOS circuit comprises a PMOS transistor comprising a gate, a first electrode, and a second electrode, the gate coupled to the input node, the first electrode coupled to the output node, and the second electrode coupled to the first supply rail.

8. The VLS circuit of claim 6, further comprising:
an inverter circuit coupled to the output node, the inverter circuit configured to invert a logic state of an output signal to generate an inverted output signal on an inverted output node;
wherein the PMOS circuit comprises a stacked PMOS transistor circuit, comprising:
a first PMOS transistor comprising a gate, a first electrode, and a second electrode, the gate coupled to the input node, and the first electrode coupled to the output node; and
a second PMOS transistor comprising a second gate, a first electrode, and a second electrode, the second gate coupled to the inverted output node, the first electrode coupled to the second electrode of the first PMOS transistor, and the second electrode coupled to the first supply rail.

9. The VLS circuit of claim 1, further comprising a keeper circuit coupled to the output node and the second supply rail;
the keeper circuit configured to maintain a coupling of the output node to the second supply rail, in response to the pre-conditioned input signal remaining at the voltage level of the discharge logic state from the evaluation phase of the pre-charge control signal until the pre-charge circuit couples the first supply rail to the output node in response to the pre-charge control signal indicating a next pre-charge phase.

10. The VLS circuit of claim 9, wherein the keeper circuit comprises an NMOS logic circuit.

11. The VLS circuit of claim 10, wherein the NMOS logic circuit comprises an NMOS transistor comprising a gate, a first electrode, and a second electrode, the gate coupled to the output node, the first electrode coupled to the second supply rail, and the second electrode coupled to the output node.

12. The VLS circuit of claim 10, wherein the NMOS logic circuit comprises:
a first NMOS transistor comprising a first gate, a first electrode, and a second electrode, the first gate coupled to an inverted output node, and the second electrode coupled to the output node; and
a second NMOS transistor comprising a second gate, a first electrode, and a second electrode, the second gate coupled to the pre-charge control signal, the first electrode coupled to the second supply rail, and the second electrode coupled to the first electrode.

13. The VLS circuit of claim 1, further comprising a clamp circuit coupled to the input node and the second supply rail, the clamp circuit configured to pull-down the input node to the second supply rail in response to a clamp control signal indicating a clamp state.

14. The VLS circuit of claim 13, wherein the clamp circuit comprises an NMOS transistor comprising a gate, a first electrode, and a second electrode, the gate coupled to the clamp control signal, the first electrode coupled to the second supply rail, and the second electrode coupled to the input node.

15. The VLS circuit of claim 1, wherein the first supply rail comprises a positive supply rail and the second supply rail comprises a negative supply rail.

16. The VLS circuit of claim 1 integrated into an integrated circuit (IC).

17. The VLS circuit of claim 1 integrated into a system-on-a-chip (SoC).

18. The VLS circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device (e.g., a smart watch, a health or fitness tracker, eyewear, etc.); a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

19. A voltage level shifter (VLS) circuit, comprising:
a means for receiving an input signal in a first voltage domain;
a means for generating a pre-conditioned input signal in the first voltage domain at a voltage level on an input node indicating a charge logic state, in response to a pre-condition control signal having a voltage level of the charge logic state indicating a pre-charge phase;
a means for coupling a first supply rail of a supply voltage relative to a second supply rail in a second voltage domain higher than the first voltage domain to an output node in response to a pre-charge control signal indicating the pre-charge phase;
a pull-up means for coupling the first supply rail to the output node in response to the pre-conditioned input signal having a voltage level of the charge logic state; and
a pull-down means comprising:
a means for decoupling the second supply rail from the output node in response to the pre-condition control signal indicating the pre-charge phase; and
a means for coupling the second supply rail to the output node in response to the pre-conditioned input signal having a voltage level of a discharge logic state in response to the pre-condition control signal having the voltage level of the discharge logic state indicating an evaluation phase.

20. The VLS circuit of claim 19, wherein:
the pull-up means further comprises a means for decoupling the first supply rail from the output node in response to the pre-conditioned input signal having a voltage level of the discharge logic state in response to the pre-condition control signal indicating the evaluation phase; and
the pull-down means further comprises a means for decoupling the second supply rail from the output node in response to the pre-conditioned input signal having a voltage level of the charge logic state.

21. A method of voltage level shifting an input signal from a lower voltage domain to a higher voltage domain, comprising:
receiving an input signal in a first voltage domain;
generating a pre-conditioned input signal on an input node in the first voltage domain at a voltage level indicating a charge logic state, in response to a pre-condition control signal having a voltage level of the charge logic state indicating a pre-charge phase;

coupling a first supply rail to an output node in response to a pre-charge control signal indicating the pre-charge phase;

coupling the first supply rail to the output node in response to the pre-conditioned input signal having a voltage level of the charge logic state;

decoupling a second supply rail from the output node in response to the pre-condition control signal indicating the pre-charge phase; and coupling the second supply rail to the output node in response to the pre-conditioned input signal having a voltage level of a discharge logic state in response to the pre-condition control signal having the voltage level of the discharge logic state indicating an evaluation phase.

22. The method of claim 21, further comprising:

decoupling the first supply rail from the output node in response to the pre-conditioned input signal having a voltage level of the discharge logic state in response to the pre-condition control signal indicating the evaluation phase; and decoupling the second supply rail from the output node in response to the pre-conditioned input signal having a voltage level of the charge logic state.

23. The method of claim 21, further comprising inverting a logic state of an output signal to generate an inverted output signal on an inverted output node;

wherein a P-type (P) metal oxide semiconductor (MOS) (PMOS) circuit comprises a stacked PMOS transistor circuit, comprising:

a first PMOS transistor comprising a gate, a first electrode, and a second electrode, the gate coupled to the input node, and the first electrode coupled to the output node; and a second PMOS transistor comprising a second gate, a first electrode, and a second electrode, the second gate coupled to the inverted output node, the first electrode coupled to the second electrode of the first PMOS transistor, and the second electrode coupled to the first supply rail.

24. The method of claim 22, further comprising maintaining a coupling of the output node to the second supply rail in response to the pre-conditioned input signal remaining at the voltage level of the discharge logic state from the evaluation phase to the pre-charge control signal until the pre-charge circuit couples the first supply rail to the output node in response to the pre-charge control signal indicating a next pre-charge phase.

25. The method of claim 22, further comprising pulling down the input node to the second supply rail in response to a clamp control signal indicating a clamp state.

26. A multiple voltage domain memory system, comprising:

a memory array in a first voltage domain comprising a plurality of memory rows of a plurality of memory bit cells each configured to store data;

a plurality of output word lines in the first voltage domain, each coupled to a row of memory bit cells among the plurality of memory bit cells; and a word line decoder comprising:

an address input interface configured to receive a memory address associated with a memory row in the plurality of memory rows to be addressed, the address input interface in a second voltage domain lower than the first voltage domain;

a word line decoder circuit in the second voltage domain configured to receive the memory address and decode the memory address into a decoded word comprising a plurality of word line bit signals; and a pre-conditioning circuit configured to:

receive a word line bit signal among the plurality of word line bit signals in the second voltage domain; and generate a pre-conditioned signal on an input node in the second voltage domain at a voltage level indicating a charge logic state, in response to a pre-condition control signal having a voltage level of the charge logic state indicating a pre-charge phase; and a plurality of voltage level shifter (VLS) circuits each comprising:

a pre-charge circuit coupled to an output word line among a plurality of output word lines and a first supply rail of a supply voltage relative to a second supply rail in the second voltage domain, the pre-charge circuit configured to couple the first supply rail to the output word line in response to a pre-charge control signal indicating the pre-charge phase;

a pull-up circuit coupled to the first supply rail and the output word line, the pull-up circuit configured to couple the first supply rail to the output word line in response to the pre-conditioned signal having a voltage level of the charge logic state; and a pull-down circuit coupled to the input node and the second supply rail, the pull-down circuit configured to:

decouple the second supply rail from the output word line in response to the pre-condition control signal indicating the pre-charge phase; and couple the second supply rail to the output word line in response to the pre-conditioned signal having a voltage level of a discharge logic state in response to the pre-condition control signal having the voltage level of the discharge logic state indicating an evaluation phase.

27. The multiple voltage domain memory system of claim 26, wherein:

the pull-up circuit is further configured to decouple the first supply rail from the output word line in response to the pre-conditioned signal having a voltage level of the discharge logic state in response to the pre-condition control signal indicating the evaluation phase; and the pull-down circuit is further configured to decouple the second supply rail from the output word line in response to the pre-conditioned signal having a voltage level of the charge logic state.

* * * * *